Figure 1:
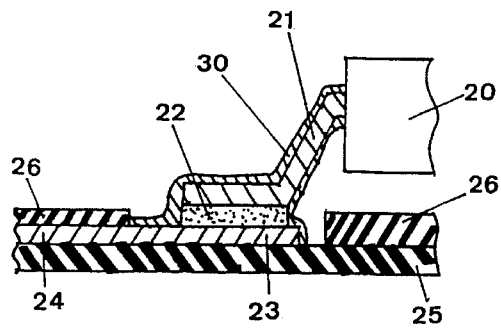

United States Patent [19]
Sullivan

[11] Patent Number: 5,574,629
[45] Date of Patent: Nov. 12, 1996

[54] SOLDERLESS PRINTED WIRING DEVICES

[76] Inventor: Kenneth W. Sullivan, 5407 Strasburg Rd., Gap, Pa. 17527

[21] Appl. No.: 128,115

[22] Filed: Sep. 29, 1993

Related U.S. Application Data

[63] Continuation-in-part of Ser. No. 704,465, May 23, 1991, abandoned, which is a continuation of Ser. No. 363,868, Jun. 9, 1989, abandoned.

[51] Int. Cl.$^6$ ..................................................... H05K 7/10
[52] U.S. Cl. ...................... 361/767; 174/260; 228/179.1; 228/180.21; 228/198; 361/808
[58] Field of Search .......................... 29/840, 843, 846; 257/700, 779, 748, 781, 784, 786, 787; 228/179.1, 180.21, 198; 361/767–779, 808; 437/206, 209, 211; 439/876; 174/255, 256, 259, 260, 261, 267

[56] References Cited

U.S. PATENT DOCUMENTS

| | | | |
|---|---|---|---|
| 4,011,980 | 3/1977 | Dvorak et al. | 228/180.21 |
| 4,339,785 | 7/1982 | Ohsawa | 361/779 |
| 4,814,944 | 3/1989 | Sagawa et al. | 228/180.21 |
| 5,019,535 | 5/1991 | Wojnarowski et al. | 437/209 |
| 5,113,580 | 5/1992 | Schroeder et al. | 29/840 |

FOREIGN PATENT DOCUMENTS

| | | | |
|---|---|---|---|
| 0050595 | 2/1989 | Japan | 29/840 |

*Primary Examiner*—Gregory D. Thompson
*Attorney, Agent, or Firm*—Frederick J. Olsson

[57] ABSTRACT

In a printed wiring device, the combination of a substrate having a metal-plateable member and an electrical component having a metal plateable lead connected with the metal-plateable member, the lead and the member being electrically interconnected by a metal layer plated on the lead and on the member and forming an electrically conductive path between the lead and the member.

5 Claims, 3 Drawing Sheets

SOLDERLESS PRINTED WIRING DEVICES

This invention relates to improvements in the art of printed wiring devices. This application is a continuation-in-part of application Ser. No. 704,465 filed May 23, 1991, abandoned, which was a continuation of my abandoned application Ser. No. 363,868 filed Jun. 9, 1989.

As will be understood, a printed wiring device (PWD) includes a dielectric substrate which has an electrically conductive wiring pattern comprising traces, lands, and/or coated holes with several components secured to the substrate and electrically connected to the wiring pattern.

Printed wiring devices came into commercial use in the late 1940's and various improvements in substrates, wiring patterns, components, and assembly techniques have evolved over the years. With respect to wiring patterns, the art has applied these patterns to substrates by the substractive process and also by the additive process. In both processes the art has used (in conjunction with other techniques) electro-plating and electroless plating techniques for the creation and preparation of traces and lands. For the interconnection of components to substrates, the art has employed the wire-wrap process, the through hole process, and the surface mount process. For present purposes it is important to point out that in such processes, from the beginning to the present time, solder has been and now is the medium to establish the electrical connection between leads and substrates.

The art has long recognized that use of solder for electrical connections has many disadvantages. These are discussed following.

(a) High temperatures. The soldering processes must be performed at temperatures around 500 degrees F. High temperature results in failure of components and substrates at assembly. It dooms components and substrates to be made of high cost, temperature-resistant materials even though the ambient temperature to which soldered parts are exposed to under operating conditions is far less than assembly temperature.

(b) Toxic materials. Solder itself, the fluxes and flux cleaners are all toxic. Avoiding danger to workers and the environment requires special treatment at assembly and special disposal procedures for waste.

(c) Through-hole process limited. This widely used process, in practice, is limited to planar substrates. This is necessary in order to allow the leads to be inserted from one side of the substrate and soldered from the opposite side. With only one side of the substrate available, the number of components which can be mounted in a given amount of space is limited.

(d) Difficult processes. Solder requires the use of many highly technical processes which are difficult to perform and require expensive equipment, for example, solder masking, hot air leveling, depositing solder paste on lands, and cleaning.

(e) Miniaturization limited. The finest pitch which is achieved with solder technology is approximately 25 mil. This requires the rheology, particle size, purity, quantity, and placement accuracy of solder paste to be precisely controlled. The result is high cost for this level of miniaturization.

(f) Joint reliability. The lack of joint reliability is the major problem in surface mounted solder joints. In assembly, solder joints have inherent contraction stresses which lead to failure in assembly and in operation. The ohmage value of solder is high and this limits the miniaturization of joints. Oftentimes, the solder does not completely wet the land and/or lead surfaces and reduces strength and increases ohmic value. The rigidity of solder joints mades same susceptible to failure with vibration and with thermal cycling.

There have been various efforts over the years to develop solutions to reduce the magnitude of the above discussed problems. These solutions have been very expensive in terms of equipment and procedures and to large extent have been cosmetic. All of such solutions have contemplated the continued use of solder.

Some examples of the solutions adapted over the years are: the use of high priced solder which will melt at somewhat lower than normal temperature; attempts to focus the heat in precise areas such as by lasers and by specialized heat development techniques such as vapor phase and infrared; altering the shape of leads for relieving stresses and even confining the solder joint to a precise shape; the constant monitoring of variables that may affect the solder joint such as solder paste, cleanliness of the surface of lands and leads, the size and shape of solder particles, the flow characteristic of solder; the x-raying of joints for voids.

So, it is self-evident that the art has recognized that electrical connection by means of solder has been a plague on the industry both from the standpoint of device manufacture and from the standpoint of the reliability of equipment employing the devices.

Therefore, a principal object of the invention is to cure the plague by eliminating solder as the electrically connecting mechanism and thereby achieve several assembly and operational advantages and especially curing the plague for the burgeoning surface mount applications.

The invention contemplates a layer of metal plating as the electrical connection medium between component leads and substrates. The invention has special utility with respect to surface mount and through-hole arrangements and further provides for the simultaneous creation of electrical connections and traces and the substantial advantage of providing for the construction of surface-mounted components having thermoplastic, plateable leads.

In the through-hole arrangement of components and substrate, it is an object of the invention to provide an improved arrangement having the electrical connections created as by plating continuous metal layers between respective holes and leads.

In the surface-mounted arrangement of components and substrate one of the objectives of the invention is to provide an improved arrangement where the mechanical joinder of leads to the wiring pattern is made by adhesive means and the electrical connections are created by plating continuous metal layers between the respective leads and the wiring pattern.

In the surface-mounted arrangement of components and substrate another of the objectives of the invention is to provide an improved arrangement which employs material for the leads and for the substrate permitting the same to be fused together and to be metal-plated and wherein the mechanical joinder of the leads and substrate is made by fusing and the wiring pattern and the electrical connections are simultaneously created by metal plating.

Various of the advantages of the invention over soldering technology are noted below. The arrangement of the list does not indicate the order of importance.

(a) Elimination of manufacturing steps. The various steps employed for solder are no longer required, such as soldering, solder paste printing, hot air leveling, solder masking, cleaning and the like.

(b) Combining of manufacturing steps. The wiring pattern and electrical connection can be simultaneously created.

(c) Reduction of toxic substance. Solder itself is toxic and the chemicals associated with soldering and solder hot air leveling are toxic and are not used.

(d) Low cost materials. The substrate material no longer has to be capable of withstanding 500 degrees F. and thus, inexpensive thermoplastic materials are employed. The same is the case for component material. The leads can be in simple easy-to-form shapes.

(e) Low resistance. Plating makes a large, homogeneous conductor between substrate and lead. The ohmic value is low. The ohmic values of traces and connection are about the same.

(f) Greater miniaturization. The 25 mil limit of solder is far exceeded. Plating permits pitches in the order of 10 mils.

(g) Reliable joints. In surface mount arrangements the use of adhesive or fusing bonding warrants the mechanical reliability of the joint and therefore, the electrical reliability of a joint.

(h) Minimum monitoring. Both electroless plating and electroplating are well-known techniques and the control of same is routine.

(i) Extension of through-hole process. With the invention, this process is not limited to planar substrates. Substrates having surfaces at different levels or stacked substrates can be employed.

(j) Component mounting. Electrical connections can be made with a component and leads disposed in a depression or receptacle formed on a molded PWD.

(k) Component and lead alignment. The use of thermoplastic leads provides for a component housing and the leads to be laterally off-set on the PWD.

(l) Cost. The invention reduces the overall cost in electronic packaging even though the use of copper is increased.

Before proceeding with the description a few general comments are in order.

Various of the materials, equipment, and processes mentioned herein are conventional and known to the art. Therefore, except as may be appropriate for descriptive purposes it will not be necessary to comment in detail on the same.

The term substrate applies to single sided, double sided, multilayer, multiwire, rigid and flexible boards, 3-d molded circuits, hybrid circuit boards, and the like and further that a wiring pattern on a substrate comprises singularly or in combination traces, lands, and holes or vias.

The term component referred to herein applies to various circuit elements such as IC chips, capacitors, resistors, or inductors, enclosed within a housing with appropriate metal leads on the circuit elements and extending out of the housing. The portions of the leads outside of the housing are metal plateable. Certain new components for surface mount will be described herein.

It will be understood that I prefer the metal plating (normally copper) to be done by electroless plating techniques. An example of such plating is the electroless plating process technology marketed by the PCK Technology Division of Kollmorgan Corp., Mellville, N.Y.

For clarity in the description below, I want to point out that substrates being made of dielectric or non-conductive material are not per se metal plateable. A substrate surface or portion of the surface can be made plateable by catalyzing. This is effected by blending a catalyzing agent such as PdCl into the resin or sensitizing the surface of the substrate in a bath with the catalyzing agent or by printing on appropriate material. Likewise, the housing of a component is not plateable but the same or portions of same are made plateable by the above mentioned technique. The same is true of adhesive, which is commented on in the next few paragraphs. The term catalyzed will mean that the material is electroless plateable.

The adhesive referred to herein may be: the electroless plateable type such as SC-204 sold by PCK Technology; or the electroplateable or non-plateable type respectively TRA-DUCT 2902 and TRA-BOND 2101 both sold by TRA-CON, INC. of Medford, Mass.

When the adhesive is plateable, the plating process make a continuous layer including the trace, the adhesive, and lead. When the adhesive is non-plateable the plating process is carried out so that the metal buildup on a trace or land and on the lead forms a bridge.

In conventional substrate/components assembly, the leads of the components are made of metal and are prepared by being plated or dipped in solder. According to the invention solder is to be eliminated and, therefore, the invention contemplates that the leads of components be prepared by being copper plated.

On the other hand, leads which have been prepared with solder which is metal plateable may be employed because a solder surface on a lead does not constitute a joint between discrete items such as between the end of a lead and a land.

With the above in mind, I will now describe typical processes for constructing surface mounted and through-hole assemblies of substrate and components. These processes do not require the use of drawings for those skilled in the art to understand the subject matter; i.e. the steps being specified and the assemblies made thereby. While the individual steps in the processes are, per se, conventional, I will, to facilitate understanding, follow each aforesaid description with brief comments with reference to simple, diagramtic sketches of the kind typically employed in the art. The foregoing sketches appear in FIGS. 1–6 and 14–17.

SURFACE MOUNT

In the conventional surface mount arrangement of substrate and components, the substrate is provided with a wiring pattern including lands and traces. The leads of the components have feet, so to speak, for resting on lands. The lands are prepared by plating or solder dipping. If the latter, the surfaces must by substantially co-planar so various leveling procedures are then employed. Solder paste is then spotted on each individual land and the components mounted. After all the components are in place on the respective lands, the assembly is subjected to reflow process to establish the solder bond between lands and leads.

In contrast, the construction of surface mounted combinations of components and substrates according to the invention will be described below under sections SM-A, SM-B, and SM-C, etc.

SM-A

A non-catalyzed conventional substrate having a wiring pattern with appropriate traces and lands is provided. A plateable adhesive is spotted on the respective lands and the components are mounted with the ends of the leads contacting the adhesive on the respective lands. The adhesive is cured. This mechanically bonds each lead to its land. The assembly is then electroless plated and copper is deposited on each trace and land, the adhesive, and the leads. This establishes a continuous metal path between each land and lead. To avoid additional copper on the traces, the same may covered with a plating resist.

In the assembly illustrated by the sketch of FIG. 1, the component 20 has as lead 21 bonded by plateable adhesive 22 to the land 23 joined with the trace 24. The land 23 and trace 24 are part of the wiring pattern and are bonded to the substrate 25. A plating resist 26 is on the trace 24 and substrate 25. Copper plating 30 is on the lead 21, adhesive 22, land 23, and trace 24. It will be understood of course that the lateral sides of the adhesive, the trace, and the land are plated.

SM-B

A catalyzed or plateable adhesive is printed on an uncatalyzed substrate in a pattern of traces and lands which simulates the conductive wiring pattern desired. The components are placed on the substrate with feet of the leads on the various land areas in engagement with the adhesive. The adhesive is then cured to bond the components and substrates together. The assembly is now electroless plated. The copper is simultaneously deposited on the catalyzed traces, land areas, and on the leads. This creates the traces and a continuous metal path between each land and its lead.

The above lends itself to a greater population of components on a substrate because lower pitch is easily attainable. Thus, the wiring pattern is applied with very thin trace areas and the land areas are omitted. The leads are made wire-like or without feet. Without lands, the space between the adjacent traces can be minimized. The widths of the leads and trace areas are made compatible.

Figure 2:
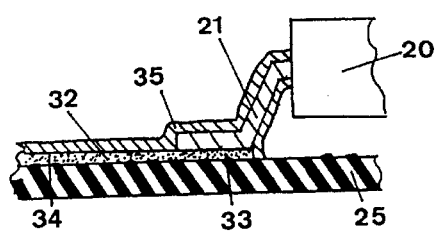

The sketch of FIG. 2 is a modification of the assembly of FIG. 1. The same numerals have been applied for corresponding parts. The component 20 has a lead 21 bonded to the plateable adhesive 32 in the form of land 33 joined with the trace 34. The land 33 and trace 34 of course are part of the wiring pattern on the substrate 25. Copper plating 35 is on the lead 21 the land 33 and trace 34.

SM-C

A plating resist of the permanent type is printed on the surface of a catalyzed substrate except in areas defining the desired traces and lands. A catalyzed adhesive is applied to the various land areas. The components are placed on the substrate with the feet of the leads on the various land areas in engagement with the adhesive. The adhesive is cured to bond the components and substrate. The assembly is then electroless plated. Copper is simultaneously deposited on the trace and land areas, on the adhesive, and on the leads. This creates the traces and a continuous metal path between each land and its lead.

For small pitch and greater density of components, the above process is carried out with lands omitted from the wiring pattern and with the leads in wire-like form.

Figure 3:
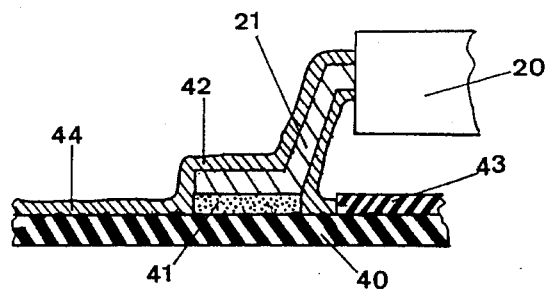

The sketch of FIG. 3 is another modification of the assembly of FIG. 1. The same numerals have been applied for corresponding parts. The component 20 has a lead 21 bonded to the substrate 40 by adhesive 41. Copper plating 42 is on the lead 21, on the adhesive 41 and on the substrate 40 between the plating resist 43 to create the traces as noted for trace 44. The top surface of the metal plateable substrate 40 is, of course, a metal plateable member.

With the above SM-A, SM-B, and SM-C processes in mind, I will now discuss important modifications which may be employed.

First, the invention contemplates that the component alone be joined to the substrate with the respective leads engaging the wiring pattern. A spot of adhesive is placed on the substrate so as to be engaged by the underside of the component housing. The component is then placed down on the substrate with the leads in contact with the desired portions of the wiring pattern. The component forced further downward until there is sufficient contact with the adhesive. This downward motion will be accommodated by slight yielding of the leads which make a firm engagement. When the desired downward position is reached, the component is held firm and the adhesive is cured.

Figure 4:
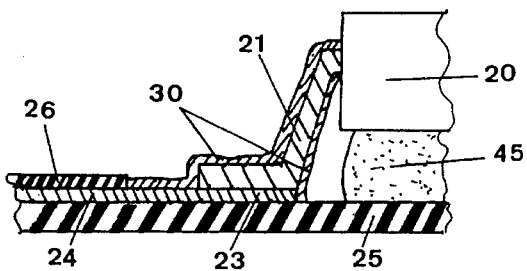

FIG. 4 is a sketch of another modification of the assembly of FIG. 1. The same numerals for corresponding parts have been applied. In this modification, the assembly is secured to the substrate 25 by adhesive 45 between the substrate 25 and the bottom of the component 20.

Figure 5:
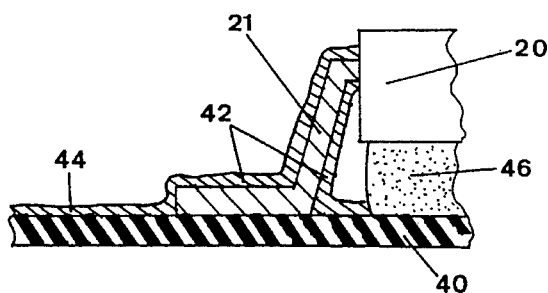

FIG. 5 is a sketch of a further modification of the assembly of FIG. 3. The same numerals for corresponding parts have been employed. In this modification, the assembly is secured to the substrate 40 by adhesive 46 between substrate 40 and component 20. Since the adhesive 41 (of FIG. 3) has been omitted, the lead 21 directly engages the substrate 40. The top surface of the plateable substrate 40, of course, serves as a metal plateable member.

In lieu of adhesive, the invention contemplates that the substrate be molded with projections to which the underside of the component housing is engaged and ultrasonically welded. In this case the substrate and component housing are thermoplastic.

Figure 6:
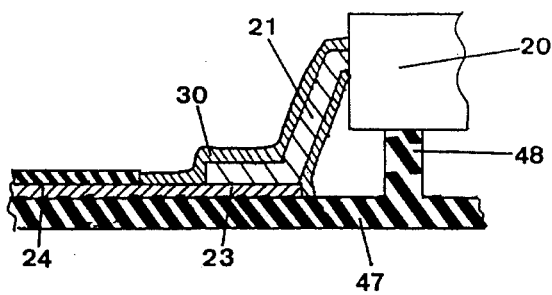

FIG. 6 is a sketch of a modification of the assembly of FIG. 1. The same numerals for corresponding parts have been employed. In this modification, the substrate 47 is molded with projection 48. The projection and the underside of the component 20 are ultrasonically welded. The substrate and component are thermoplastic.

Second, it is pointed out that in the SM-B and SM-C processes the areas defining the desired wiring pattern of traces and/or lands may be provided via the PSP process licensed by PCK Technology. In this process, a non-catalyzed, molded substrate (usually thermoplastic) has a surface selectively catalyzed or sensitized to form areas simulating the wiring pattern. These areas are metal-plateable.

In addition to the previously described surface-mount and through-hole processes and the assemblies made thereby, the invention contemplates a novel surface mount component and a novel assembly of substrate and such component along with the process for fabricating the same.

According to this aspect of the invention, both substrates and leads are manufactured from inexpensive thermoplastic materials and fusion bonded for ultimate mechanical strength and catalyzed for metal plating to create wiring patterns and electrical connection.

One way of fabricating a component of the kind mentioned is noted following in connection with FIGS. 7–10 which are diagrammatic, perspective views illustrating the construction.

Figure 7:
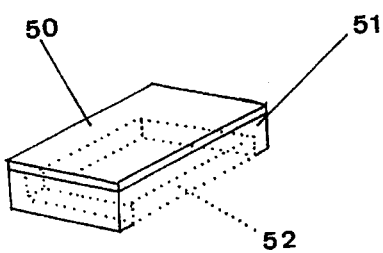
Figure 8:
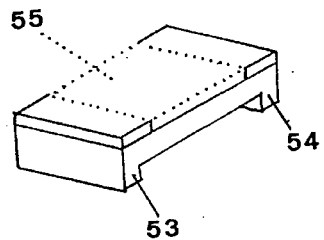

Referring to FIG. 7, a layer of copper foil 50 is epoxied to a flat sheet 51 of plateable thermoplastic material. The composite is machined as noted by dotted lines 52 to obtain the shape of the component as noted in FIG. 8 which includes mounting legs 51 and 54.

Figure 9:
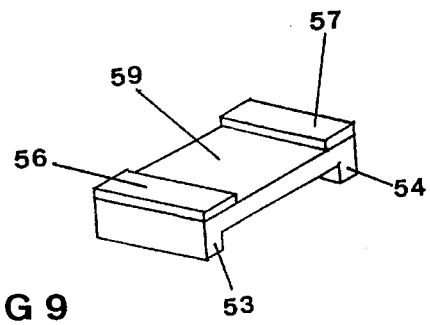

Next, the center of the copper foil 50 is etched away as noted by dotted lines 55 leaving sections 56 and 57 and creating the configuration as seen in FIG. 9.

Figure 10:
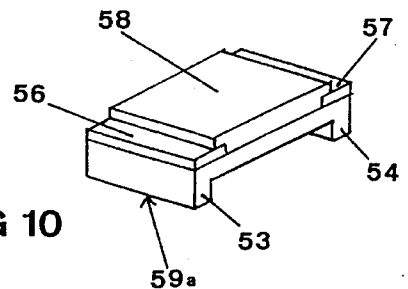

Following the above, a thick film resistor or electrical circuit element 58 is applied to the component in the section 59 between and in contact with the remaining sections 56 and 57 as depicted in FIG. 10. The sections 56 and 57 being conductive, effectively become leads of the element 58.

A permanent plating resist is now applied to all areas except the legs 53 and 54 and the sections 56 and 57. The plating resist and the area 59 in effect become a housing for the electrical circuit element 58. It will be evident that the legs 53 and 54 and sections 56 and 57 which are not covered by the resist can be metal plated. The legs 53 and 54 and sections 56 and 57 and the plating thereon become the leads of the component.

The component 59a of FIG. 10 is placed on the wiring pattern (traces or lands) of the substrate with the bottom of the legs 53 and 54 in firm engagement. The legs are then fusion bonded to the substrate preferably by ultrasonic techniques. Bonding may be effected by solvent techniques and when this is done the solvent is spotted on the wiring pattern prior to the positioning of the legs.

Figure 11:
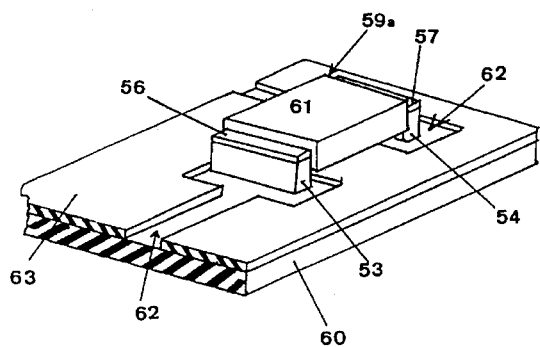
Figure 12:
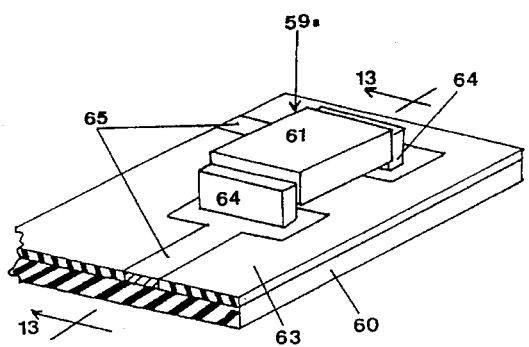
Figure 13:
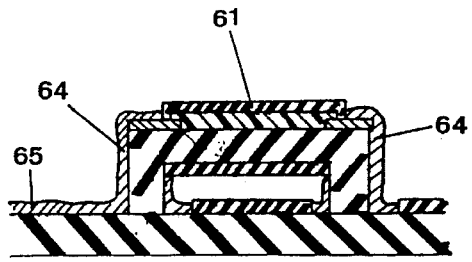

The foregoing is illustrated in the sketch of FIGS. 11, 12, and 13. FIG. 11 shows the assembly prior to plating and FIG. 12 shows the assembly as plated. FIG. 13 is a cross section taken along the lines 13—13 of FIG. 12. The same numerals have been employed for corresponding parts. The legs 53 and 54 are bonded to the substrate 60. The plating resist on the circuit element 58 and on the plateable thermoplastic material 51 is indicated at 61. The plating resist on the substrate 60 which will create the wiring pattern 62 is indicated at 63. In FIG. 12, the assembly of FIG. 11 has been plated as indicated at 64 and the plated wiring pattern is indicated at 65.

It will be apparent from the above description that when the legs 53 and 54 are fusion bonded to the substrate, the legs become integral with the substrate and in effect are projections extending outwardly of the substrate. This provides an additional way of fabricating an assembly presently under consideration.

Thus, a substrate having appropriately positioned flat-top, legs or projections which are in a simulated metal plateable wiring pattern can be fabricated by molding and by the PSP process previously mentioned. A component having a non-plateable housing with plateable leads can be positioned on the legs or projections and adhesively bonded to same. The substrate, the legs or projections, and the leads are metal plated to form the wiring pattern and the electrical connections between the leads and the wiring pattern.

Figure 14:
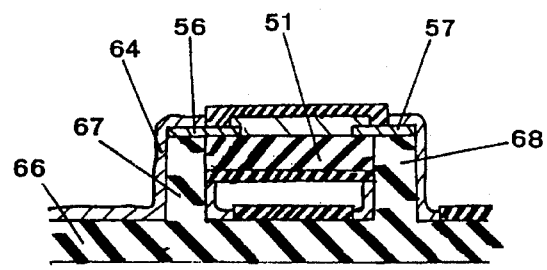

The projection modification just described is shown in sketch of FIG. 14. The same numerals for corresponding part have been employed. The substrate 66 has been molded with projections 67 and 68. The sections or leads 56 and 57 are adhesively bonded to the tops of the projections. When the assembly is plated, it will assume a condition comparable to the plating shown in FIG. 12.

As noted heretofore, the invention find utility for the through-hole processes. This will now be discussed.

THROUGH-HOLE

In the conventional through-hole arrangement of substrate and components, the substrate is provided with a wiring pattern including metal covered vias or holes respectively electrically connecting pattern traces. The leads of components are provided with rigid or flexible retention sections which are prepared by solder dipping or by plating. The leads of a component are inserted into the holes so that the retention section of each lead engages the metal covering herein. After the substrate is fully loaded with components, the same is wave soldered so that solder is forced into the holes and around the leads.

The construction of a through-hole combination of substrate and components according to the invention will be described below under sections TH-A, TH-B, and TH-C.

THA

A non-catalyzed conventional substrate having a wiring pattern with appropriate traces and holes is provided. The components are then inserted into the appropriate holes. The assembly is then electroless plated and copper is deposited on each trace, on the available surface of each hole, and on each lead. This creates a continuous metal path between the respective traces/holes and leads. A plating resist may be employed to avoid additional copper on the traces.

Figure 15:
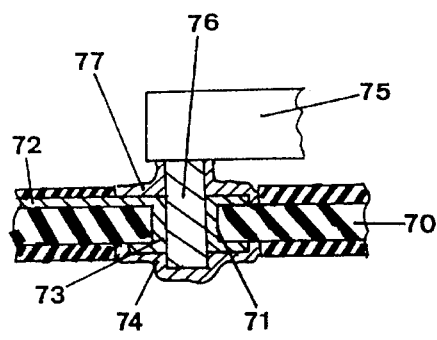

In the sketch of FIG. 15, the substrate 70 has a hole 71. The substrate carries the wiring pattern which has the trace 72 extending into hole 71 at 73 and around the bottom of the hole as indicated at 74. The component 75 has a lead 76 which extends into hole 71 in engagement with the part of wiring pattern indicated at 73. Copper plating 77 is on the trace 72, lead 76, and on part 74.

TH-B

A catalyzed adhesive is printed on an uncatalyzed substrate in the pattern of traces and in holes which simulates the conductive wiring pattern desired. The leads of the components are inserted in the appropriate holes in engagement with adhesive. The adhesive is cured. This mechanically bonds the substrate and components. The assembly is then electroless plated so that copper is simultaneously deposited on the adhesive defining trace areas, on the surface of each lead, and on the adhesive in its hole. This creates the traces and continuous metal paths between the respective leads and traces.

Figure 16:
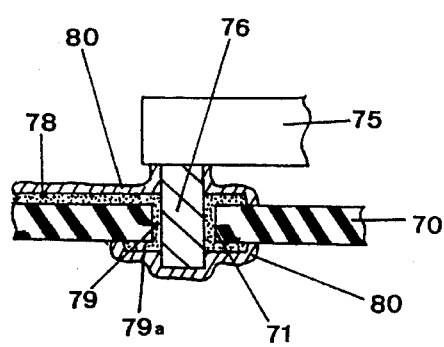

The sketch of FIG. 16 is a modification of the assembly of FIG. 15. The same numerals for corresponding parts have been applied. The substrate 70 has a hole 71. The substrate carries plateable adhesive 78 including the part 79 in the hole 71 and part 79b surrounding the bottom of hole 71. The component 75 has a lead 76 in the hole 71 and is in contact with plateable adhesive 78, 79 and 79a. Copper plating 80 is on the adhesive 78, 79, and 79a and on the lead 76.

TH-C

A plating resist is printed on a catalyzed substrate except in areas defining the holes and in the areas defining the desired traces. The leads of the various components are inserted into the holes. The assembly is then electroless plated with copper. Copper is simultaneously deposited on the catalyzed trace and available hole areas and on each lead. This creates a continuous metal path respectively between the leads and traces.

Figure 17:
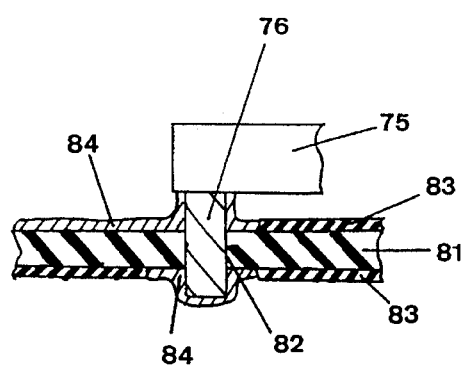

The sketch of FIG. 17 is a modification of the assembly of FIG. 15. The same numerals for corresponding parts have been applied. The substrate 81 has a hole 82. The substrate carries a plating resist 83. The component 75 has a lead 76 in the hole 82. Copper plating 84 is on the lead 76 and substrate 81.

In connection with the TH-B and TH-C processes, the following is to be noted. In the description concerning surface-mount, I referred to the PSP process for creating metal plateable areas simulating traces and/or lands. It will be understood that in lieu of the processes of TH-B, and TH-C, the PSP process can be employed to create the metal plateable trace areas and the metal plateable holes.

In the surface-mount and through-hole processes previously described, I referred to electroless plating.

An assembly of a substrate and components can be made using conventional electro-plating techniques. This approach requires extra steps of electro-plating etch-resistant metal and the use of non-permanent plating resist which must be stripped away. A typical procedure using electro-plating will be noted below.

First, a thin film of copper is placed on a surface of a substrate. If the final wiring pattern is to include holes, the film must cover the inside of each hole.

A non-permanent plating resist is placed on the copper film except in a arrangement which simulates the desired wiring pattern.

Next, the electroplateable adhesive is placed on the sections of the simulated wiring pattern on which the leads of the components are to be mounted.

The leads of the various components are now placed in the appropriate position on the substrate in engagement with the adhesive. If surface mounted, the feet of the leads are placed on the respective land and if through-hole, the leads are inserted into the appropriate holes. The components and leads must be configured so that there is a space between the bottom of the component and the surface of the substrate. The adhesive is then cured to bond the components to the substrate.

Next, copper is electro-plated on the wiring pattern formed by the adhesive and on the component leads.

Following the copper plating, and etch resistant metal such as Ni is electro-plated over the copper. The non-permanent plating resist is then stripped so that the original copper film is exposed. This copper is then etched away.

Thus, there is created an assembly comprising a substrate with a wiring pattern and with components mechanically bonded and electrically connected thereto.

It will be understood that the previously described technique of employing adhesive on the component rather than on the leads is applicable to the electroplating procedure.

I claim:

1. In a combination of a substrate having a metal-plateable member, and an electrical component having a metal plateable lead connected with the metal-plateable member, improved means for electrically connecting the lead and the member comprising;

a metal layer plated on said lead and on said member and forming an electrically conductive path between the lead and the member, and said lead being connected to said metal-plateable member by an adhesive.

2. The combination of claim 1 wherein said adhesive is metal plateable.

3. The combination of claim 1 wherein said metal-plateable member includes a land and said lead is connected to said land.

4. The combination of claim 1 wherein said metal-plateable member includes a trace and said lead is connected to said trace.

5. The combination of claim 1 wherein said metal-plateable member is a hole and said lead is in said hole.

* * * * *